United States Patent
Walukiewicz et al.

(10) Patent No.: US 9,660,126 B2
(45) Date of Patent: May 23, 2017

(54) PHOTOVOLTAIC DEVICE WITH THREE DIMENSIONAL CHARGE SEPARATION AND COLLECTION

(75) Inventors: Wladyslaw Walukiewicz, Kensington, CA (US); Lothar A. Reichertz, Berkeley, CA (US); Iulian Gherasoiu, Gilbert, AZ (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 13/312,780

(22) Filed: Dec. 6, 2011

(65) Prior Publication Data

US 2012/0125417 A1    May 24, 2012

Related U.S. Application Data

(60) Provisional application No. 61/420,197, filed on Dec. 6, 2010.

(51) Int. Cl.
*H01L 31/0352* (2006.01)
*H01L 31/065* (2012.01)
(Continued)

(52) U.S. Cl.
CPC ...... *H01L 31/065* (2013.01); *H01L 31/03048* (2013.01); *H01L 31/072* (2013.01); *Y02E 10/544* (2013.01); *Y02P 70/521* (2015.11)

(58) Field of Classification Search
CPC .................................................. H01L 31/03044
(Continued)

(56) References Cited

U.S. PATENT DOCUMENTS

| 8,039,740 B2 | 10/2011 | Walukiewicz et al. |
| 2008/0314447 A1 | 12/2008 | Walukiewicz et al. |
| 2009/0173373 A1 | 7/2009 | Walukiewicz et al. |

OTHER PUBLICATIONS

L.A. Reichertz, K.M. Yu, Y. Cui, M.E. Hawkridge, J.W. Beeman, Z. Liliental-Weber, J.W. Ager III, W. Walukiewicz, W.J. Schaff, T.L. Williamson, M.A. Hoffbauer, "InGaN thin films grown by ENABLE and MBE techniques on Silicon Substrates", MRS Proceedings, vol. 1068, 2008.*

(Continued)

*Primary Examiner* — Jayne Mershon
(74) *Attorney, Agent, or Firm* — Lawrence Berkeley National Laboratory

(57) ABSTRACT

A photovoltaic device having three dimensional (3D) charge separation and collection, where charge separation occurs in 3D depletion regions formed between a p-type doped group III-nitride material in the photovoltaic device and intrinsic structural imperfections extending through the material. The p-type group III-nitride alloy is compositionally graded to straddle the Fermi level pinning by the intrinsic structural imperfections in the material at different locations in the group III-nitride alloy. A field close to the surfaces of the intrinsic defects separates photoexcited electron-hole pairs and drives the separated electrons to accumulate at the surfaces of the intrinsic defects. The intrinsic defects function as n-type conductors and transport the accumulated electrons to the material surface for collection. The compositional grading also creates a potential that drives the accumulated separated electrons toward an n-type group III-nitride layer for collection. The p-type group III-nitride alloy may comprise an alloy of InGaN, InAlN or InGaAlN.

20 Claims, 6 Drawing Sheets

(51) Int. Cl.
*H01L 31/0304* (2006.01)
*H01L 31/072* (2012.01)

(58) Field of Classification Search
USPC .................................. 136/244, 256, 262
See application file for complete search history.

(56) References Cited

OTHER PUBLICATIONS

G.F. Brown, J.W. Ager III, W. Walukiewicz, J. Wu, "Finite element simulations of compostionally graded InGaN solar cells", Solar Energy Materials and Solar Cells, pp. 478-483, Nov. 27, 2009.*
Gräztel, Michael, "Dye-sensitized solar cells", Journal of Photochemistry and Photobiology C: Photochemistry Review, vol. 4, 2003, pp. 145-153.
Fan, Zhiyong et al., "Three-dimensional nanopillar-array photovoltaics on low-cost and flexible substrates", Nature Materials, vol. 8, Aug. 2009 pp. 648-653 and Supplemental pp. 2-13.
Zhou, Yunfei et al., "Organic-Inorganic Hybrid Solar Cells: State of the Art, Challenges and Perspectives", Solar Cells—New Aspects and Solutions, pp. 95-120.
Kou, Liangzhi et al., "Change carrier separation induced by intrinsic surface strain in pristine ZnO nanowires", Applied Physics Letters, vol. 97, 2010, 3 pages.
Patent Cooperation Treaty, PCT International Search Report; issued in Connection with PCT/US2011/063607; Jul. 9, 2012; 3 pages; Korea.
Patent Cooperation Treaty, PCT Written Opinion of the International Searching Authority; issued in Connection with PCT/US2011/063607; Jul. 9, 2012; 3 pages; Korea.
Li, S.X. et al., "Fermi-level Stabilization Energy in Group III Nitrides", The American Physical Society, Physical Review B 71, 161201, 2005, 4 pages.

* cited by examiner

PHOTOVOLTAIC DEVICE WITH THREE DIMENSIONAL CHARGE SEPARATION AND COLLECTION

CROSS REFERENCE TO RELATED APPLICATION(S)

This application claims priority to U.S. Provisional Patent Application Ser. No. 61/420,197, entitled "Photovoltaic Device with Three Dimensional Charge Separation and Collection," filed on Dec. 6, 2010, the contents of which are incorporated herein by reference in its entirety.

BACKGROUND OF THE INVENTION

Field of the Invention

The invention relates generally to solar cells and, more particularly, to full solar spectrum group III-nitride solar cells having novel and improved ways to separate and collect photoexcited charges.

Background Discussion

Solar or photovoltaic cells are semiconductor devices having p-n junctions which directly convert radiant energy of sunlight into electrical energy. Conversion of sunlight into electrical energy involves three major processes: absorption of sunlight into the semiconductor material; generation and separation of positive and negative charges creating a voltage in the solar cell; and collection and transfer of the electrical charges through terminals connected to the semiconductor material. A single depletion region for charge separation typically exists in the p-n junction of each solar cell.

Current traditional solar cells based on single semiconductor material have an intrinsic efficiency limit of approximately 31%. A primary reason for this limit is that a semiconductor has a specific energy gap that can only absorb a certain fraction of the solar spectrum with photon energies ranging from 0.4 to 4 eV. Light with energy below the bandgap of the semiconductor will not be absorbed and converted to electrical power. Light with energy above the bandgap will be absorbed, but electron-hole pairs that are created quickly lose their excess energy above the bandgap in the form of heat. Thus, this energy is not available for conversion of electrical power.

Solar cells with higher efficiencies can be achieved by using stacks of solar cells made of semiconductors with different bandgaps, thereby forming a series of solar cells, referred to as "multi-junction," "cascade," or "tandem" solar cells. Multi-junction solar cells are made by connected a plurality (e.g., two, three, four, etc.) of p-n junction solar cells. Tandem cells are typically formed using higher gap materials in the top cell to convert higher energy photons, while allowing lower energy photons to pass down to lower gap materials in the stack of solar cells. The bandgaps of the solar cells in the stack are chosen to maximize the efficiency of solar energy conversion, where tunnel junctions are used to series-connect the cells such that the voltages of the cells sum together. Such multi-junction solar cells require numerous layers of material to be formed in a complex multi-junction stacked arrangement.

A standard photovoltaic (PV) device is a semiconductor with a planar p-n junction. Solar photons generate electrons in the conduction band and holes in the valence band. The charges are separated by the built in field at the junction and electrons are collected on the n side and holes on the p side of the junction. A modified form of a planar junction PV device is a hetero p-n junction in which p and n side of the junction are made of different materials. For example CdS/CdTe device comprises n-type CdS layer in contact with p-type CdTe absorber layer. In this case, the electrons are transferred into the n-type CdS and holes into p-type CdTe. In both instances, charge separation occurs at the flat junction parallel to the surfaces. The problem can be treated in one dimensional approximation with the only relevant axis perpendicular to the device surface.

In hybrid PV devices two different materials form separate interconnected networks. The materials are not intentionally doped but have different electron affinities and ionization energies. Photoexcited electron-hole pairs are separated at the interfaces with electrons being transferred to the large electron affinity material and holes being transferred to lower ionization material. Electrons and holes are collected with proper metal electrodes on the opposite side of the device. An example of such hybrid cells are dye sensitized cells in which electron-collecting $TiO_2$ clusters are embedded in the hole-collecting liquid or solid electrolyte.

The operational voltage of a standard PV device is related to the band gap of the semiconductor whereas the current depends on the charge collection efficiency which in turn is mainly determined by the minority carrier (holes on the n-type side and electrons on the p-type side) diffusion length. The diffusion length has to be comparable or larger than the thickness of the light absorbing layer. This puts stringent requirements on the quality of the semiconductor material. In poor quality, highly defective semiconductor charge trapping centers can reduce the carrier lifetime and thus also diffusion length resulting in reduced power conversion efficiency.

SUMMARY

An improved photovoltaic device with three dimensional (3D) charge separation and collection is provided. In one or more embodiment, a unique 3D charge separation occurs in a depletion region formed between a p-type doped group III-nitride material in the photovoltaic device and intrinsic structural imperfections in the material, such as threading dislocations, grain boundaries, columns and the like. In one or more embodiments, the photovoltaic device with three dimensional (3D) charge separation and collection utilizes the unique properties of group III-nitride alloys by utilizing a p-type group III-nitride alloy compositionally graded to straddle the Fermi level pinning by the intrinsic structural imperfections in the material at different locations in the group III-nitride alloy. In one or more embodiments, a field close to the surfaces of the intrinsic structural imperfections separates photoexcited electron-hole pairs and drives the separated electrons to accumulate at the surfaces of the intrinsic structural imperfections, where the intrinsic structural imperfections function as n-type conductors and transport the accumulated photoexcited electrons to the surface of the film for collection. In one or more embodiments, the compositional grading of the group III-nitride alloy also creates an additional potential that drives the separated electrons that have accumulated around the intrinsic structural imperfections toward an n-type group III-nitride layer for collection.

In one or more embodiments, the p-type group III-nitride alloy utilized in the photovoltaic device for three dimensional (3D) charge separation and collection comprises an alloy of InGaN, InAlN or InGaAlN.

DRAWINGS

The features of the present disclosure will become more apparent with reference to the following description taken in conjunction with the accompanying drawings and in which.

DETAILED DESCRIPTION

The following description and drawings are illustrative and are not to be construed as limiting. Numerous specific details are described to provide a thorough understanding. However, in certain instances, well known or conventional details are not described to avoid obscuring the description. References to one or an embodiment in the present disclosure are not necessarily references to the same embodiment; and, such references mean at least one. The use of headings herein are merely provided for ease of reference, and shall not be interpreted in any way to limit this disclosure or the claims.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Figure 1:
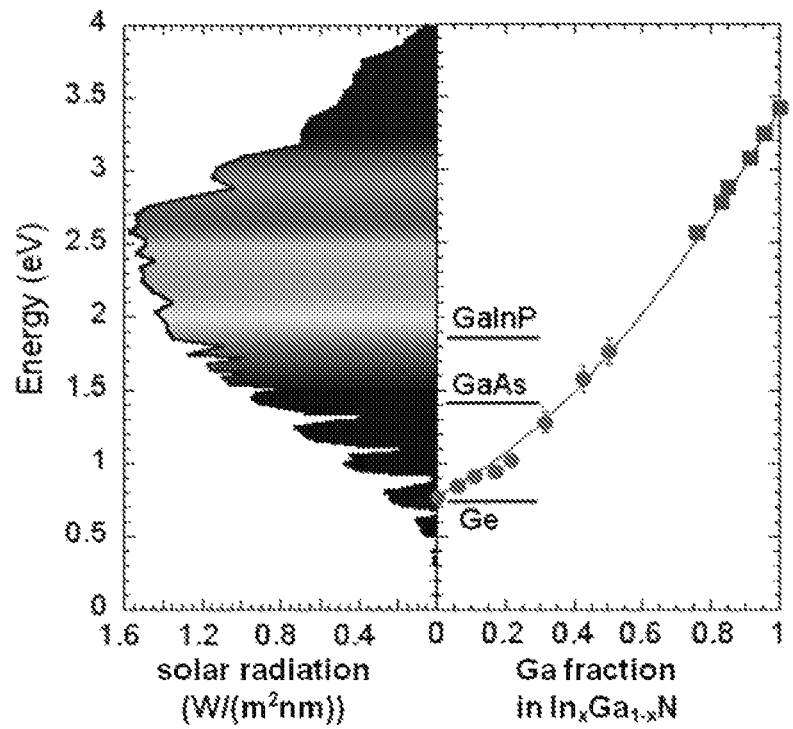
FIG. 1 is a graphical illustration of the direct energy gaps of InGaN alloys having varying concentrations of Ga in comparison to the solar spectrum.

Group III-nitride alloys have direct energy gaps spanning a broad range from 0.7 eV in InN to 3.4 eV in GaN to even much larger gap of 6.1 eV in AlN. This extremely wide range of bandgaps places the material system in a unique position for a variety of applications in optoelectronic devices. As shown in FIG. 1, the energy gap of InGaN alloys provides an almost perfect match to the solar spectrum making this material suitable for high efficiency multijunction solar cells. An unusual feature of InGaN alloys is that the electron affinity varies from 4.1 eV in GaN to about 5.8 eV in InN. This has important consequences for the Fermi level pinning position by native vacancy like defects on surfaces (S), grain boundaries (GB) and/or threading dislocations (TD).

Figure 2:
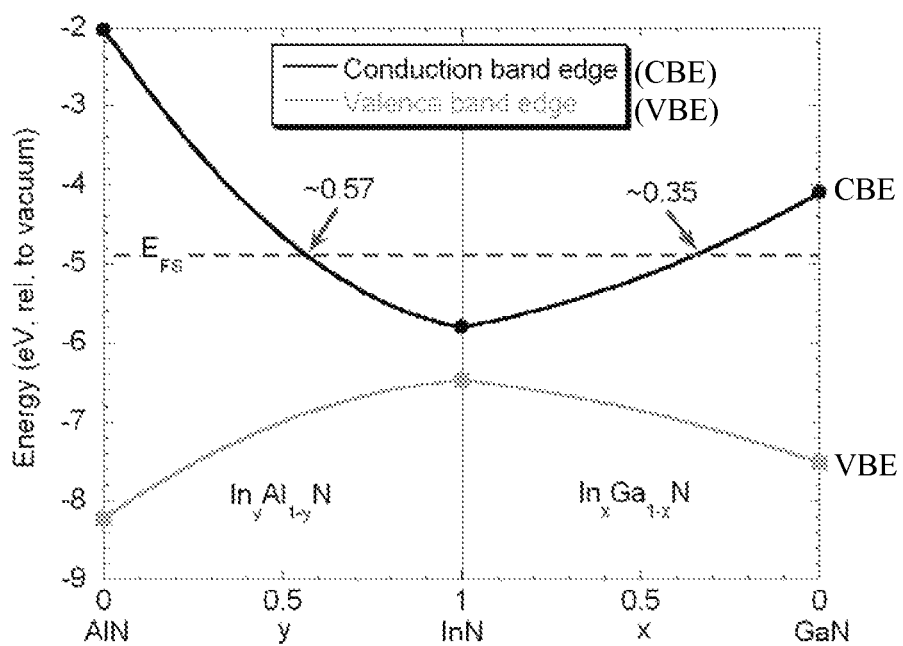
FIG. 2 is a graphical illustration of a band diagram for InGaN and InAlN alloys in accordance with one or more embodiments of the present disclosure showing the location of the conduction and valence band edges vs. composition in $In_xGa_{1-x}N$ and $In_yAl_{1-y}N$.

Referring now to FIG. 2, a graphical illustration is provided of a band diagram for InGaN and InAlN alloys in accordance with one or more embodiments of the present disclosure showing the location of the conduction and valence band edges vs. composition in $In_xGa_{1-x}N$ and $In_yAl_{1-y}N$, where $0 \le x \le 1$ and $0 \le y \le 1$. The Fermi level stabilization energy, $E_{FS}$, represents the Fermi level pinning position at the surfaces of intrinsic defects or discontinuities in the material, such as threading dislocations, grain boundaries, columns and other intrinsic surfaces. As shown in FIG. 2, the Fermi level pinning position represented by $E_{FS}$ is located above the conduction band edge in InN and below the conduction band in GaN. For InGaN, the Fermi level stabilization energy, $E_{FS}$, coincides with the conduction band edge at $In_{0.35}Ga_{0.65}N$. This indicates that in $In_xGa_{1-x}N$ conducting electrons will accumulate at Ss, GBs and TDs for x>0.35, whereas the charge carriers are trapped on the defect states in the band gap for x<0.35 such that the conducting electrons will be depleted for x<0.35. In $In_yAl_{1-y}N$ alloys, conducting electrons will accumulate at Ss, GBs and TDs for y>0.57, whereas the charge carriers are trapped on the defect states in the band gap for y<0.57 such that the conducting electrons will be depleted for y<0.57. While in one or more embodiments the Fermi level stabilization energy, $E_{FS}$, is described as coinciding with the conduction band edge at $In_{0.35}Ga_{0.65}N$ and $In_{0.57}Al_{0.43}N$, it is understood that the exact composition of the group III-nitride alloy utilized in the teachings of the present disclosure may vary from these values depending upon where the conduction band edge of the particular group III-nitride alloy being utilized happens to coincide with the Fermi level stabilization energy, $E_{FS}$.

In one or more embodiments, a photovoltaic device is provided that utilizes the unique properties of group III-nitride alloys that allow their conduction band to be tuned to straddle the Fermi level pinning position at the surfaces of intrinsic defects or discontinuities in the material, such as threading dislocations, grain boundaries, columns and other intrinsic surfaces of group III-nitride alloys to provide a new photovoltaic device having three dimensional (3D) charge separation and collection. In one or more embodiments, the photovoltaic device with three dimensional (3D) charge separation and collection will be described using the case of InGaN alloys, but it is understood that the teachings of this disclosure are also interchangeably applicable to InAlN ternary or InGaAlN quaternary alloys. Further, it is understood that the teachings of this disclosure could also utilize other materials having similar functional characteristics that allow the materials to be used in the photoactive layer of a PV device while allowing the composition of the materials to be altered to tune their conduction band to straddle the Fermi level pinning position at the surfaces of intrinsic defects in the materials.

During the formation of solar cells, certain defects in the films or layers of the solar cell occur during the growth process. These intrinsic defects cause slight discontinuities in the structure of the material, such as threading dislocations, grain boundaries, columns and other intrinsic surfaces. In one or more embodiments, for those intrinsic defects that extend between the top and bottom surfaces of the films or layers, for certain p-type group III-nitride alloys, the surfaces of these intrinsic defects collect and accumulate photoexcited electrons. In one or more embodiments, there is an electric field close to the intrinsic defects that drives the photoexcited electrons to the surfaces of the intrinsic defects, where the intrinsic defects function as n-type conductors and transport the accumulated photoexcited electrons to the surface of the film for collection. In the various embodiments described herein, the intrinsic defects may be described as threading dislocations, but it is understood that such embodiments are equally applicable to any intrinsic defects extending between the top and bottom surfaces of the group III-nitride alloy and can be interchangeably used with the threading dislocations described in the various embodiments herein.

In group III-nitrides, threading dislocations are formed to accommodate strain associated with an epitaxial growth on the lattice mismatched substrates. The dislocations propagate along the growth direction and the exits of the dislocation cores can be observed by various surface techniques. Typical threading dislocation (TD) density ranges from $10^9$ to $10^{10}$ cm$^{-2}$ for ternary nitride alloys. Thus, the average distance between TDs is about 100 to 350 nm.

Figure 3:
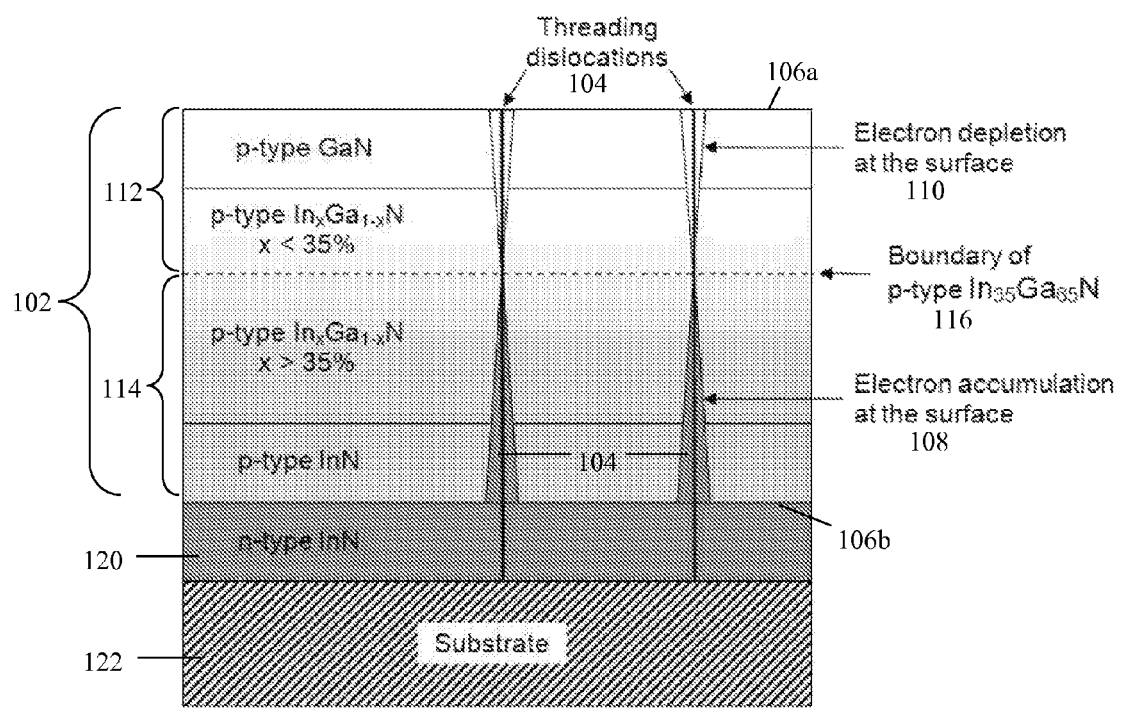
FIG. 3 is a block diagram representation of the layers of a photovoltaic device with three dimensional (3D) charge separation and collection in accordance with one or more embodiments of the present disclosure.

In one or more embodiments, a photovoltaic (PV) device 100 having three dimensional (3D) charge separation and collection is provided as illustrated in the block schematic illustration of FIG. 3 based on a p-type doped group III-nitride material 102. In one or more embodiments, the PV device 100 includes a thin n-type group III-nitride layer 120, such as InN, grown on a conducting substrate 122, such as Si, followed by a p-type group III-nitride compositionally graded layer 102.

In one or more embodiments, the p-type doped group III-nitride layer 102 is formed as a p-type layer by doping the Group III-nitride layer 102 with a p-type dopant, such as magnesium (Mg), while the n-type group III-nitride layer 120 is formed as an n-type layer by doping the n-type group III-nitride layer 120 with an n-type dopant, such as silicon (Si), selenium (Se) germanium (Ge), or sulfur (S). Typical doping levels for n-type and p-type layers range from $10^{15}$ cm$^{-3}$ to $10^{19}$ cm$^{-3}$. The actual doping levels depend on other characteristics of the layers 102 and 104 of the solar cell 100 and can be adjusted within and outside of this range to maximize the efficiency. The n-type group III-nitride layer 120 can e also kept undoped as the "as grown" InGaN alloys tend to exhibit n-type conductivity. Since undoped InGaN films are generally n-type as grown, in one or more embodiments the Group III-nitride layer 102 can be doped with Mg acceptors so that the Group III-nitride layer 102 behaves as a p-type.

In p-type layer 102, threading dislocations 104 resulting from the formation processes extend between the top surface 106a and bottom surface 106b of the p-type layer 102. In one or more embodiments, the pinning of the Fermi level on the core of the threading dislocation 104 results in formation of depletion regions around the threading dislocation 104. In one or more embodiments, the composition of the p-type layer 102 is compositionally graded so that its conduction band edge straddles the Fermi level pinning position on the threading dislocation 104, such that the conduction band edge of a bottom portion of the p-type layer 102 will fall beneath the Fermi level pinning position on the threading dislocation 104 while the conduction band of a top portion of the p-type layer 102 will fall above the Fermi level pinning position on the threading dislocation 104.

The electrostatic field in the depletion region splits photoexcited electron-hole pairs and separates electrons from holes. The electrons are transferred to the threading dislocations 104 and holes remain in the p-type layer 102. Depending upon the location of the conduction band edge of the p-type layer 102 in relation to the Fermi level pinning position on the threading dislocation 104, the photoexcited electrons will either accumulate or be depleted in the depletion regions around the threading dislocation 104. As shown in FIG. 3, electron accumulation occurs around the threading dislocation 104 at 108 in the bottom portion of the p-type layer 102 having a conduction band that falls beneath the Fermi level pinning position on the threading dislocation 104. Conversely, electron depletion occurs around the threading dislocation 104 at 110 in the top portion of the p-type layer 102 having a conduction band that falls above the Fermi level pinning position on the threading dislocation 104 where the charge carriers are trapped on the defect states.

In one ore more embodiments, the p-type doped group III-nitride layer 102 comprises $In_xGa_{1-x}N$ having a compositionally graded fraction of In that extends below and above a fractional composition of In of x=0.35 in different respective portions of the $In_xGa_{1-x}N$ layer 102 along the path of the threading dislocation 104. The top portion 112 of the $In_xGa_{1-x}N$ layer 102 has an In fraction of x<0.35 such that the conduction band of the top portion 112 falls above the Fermi level pinning position on the threading dislocation 104. The bottom portion 114 of the $In_xGa_{1-x}N$ layer 102 has an In fraction of x>0.35 such that the conduction band edge of the bottom portion 114 falls beneath the Fermi level pinning position on the threading dislocation 104. The top portion 112 and bottom portion 114 are separated by boundary 116 where $In_{0.35}Ga_{0.65}N$.

In the particular embodiment illustrated in FIG. 3, the p-type doped group III-nitride layer 102 is compositionally graded fully from InN at bottom surface 106b to GaN at top surface 106a. In this particular embodiment, the In fraction in the p-type layer 102 is compositionally graded to form p-type InN below a region of p-type $In_xGa_{1-x}N$, where x>0.35, that is below a boundary 116 where x=0.35 (i.e., $In_{0.35}Ga_{0.65}N$), that is below a region of p-type $In_xGa_{1-x}N$, where x<0.35, that is below p-type GaN. In the region of p-type $In_xGa_{1-x}N$ where x>0.35, photoexcited electrons will accumulate around threading dislocation 104 at area 108. The compositional grading of the p-type layer 102 may result in the electron accumulation area 108 may gradually increasing in size with a greater accumulation of electrons as the threading dislocation 104 approaches bottom surface 106b. Conversely, in the region of p-type $In_xGa_{1-x}N$ layer 102, where x<0.35, photoexcited electrons will be depleted around threading dislocation 104 at area 110, where the compositional grading of the p-type layer 102 may result in the electron depletion area 110 may gradually increasing in size with a greater depletion of electrons as the threading dislocation 104 approaches top surface 106a. Again, while the embodiment of FIG. 3 is described as having the Fermi level stabilization energy, $E_{FS}$, coincide with the conduction band edge of $In_xGa_{1-x}N$ at x=0.35, it is understood that the exact value of x where the Fermi level stabilization energy, $E_{FS}$, coincides with the conduction band edge of $In_xGa_{1-x}N$ may vary from this exact value of x in different photovoltaic (PV) devices 100.

When describing that the Indium (In) is compositionally graded in the $In_xGa_{1-x}N$ layer 102, it is understood that such grading represents an overall or general change in the concentration of Indium (In) from one portion of the alloy to another portion of the alloy, where the rate of change of such Indium (In) concentration may occur linearly, non-linearly, gradually, non-gradually, uniformly or non-uniformly throughout the alloy. It is also understood that the Indium (In) concentration may not vary at all between certain portions of the alloy. In one or more embodiments, the main compositional grading requirements for the PV device 102 in order to provide the desired 3D charge separation throughout the p-type $In_xGa_{1-x}N$ layer 102 are that a lower portion of the p-type $In_xGa_{1-x}N$ layer 102 possess an In concentration greater than 35% (x>0.35) while an upper portion of the p-type $In_xGa_{1-x}N$ layer 102 possess an In concentration less than 35% (x<0.35). In addition to charge separation, the compositional grading may further be selected appropriately in order to separately create an additional potential that drives the separated electrons that have accumulated around threading dislocation 104 toward the n-type group III-nitride layer 120, where the electrons can be collected to produce solar cell current.

This spatial separation of electrons and holes increases the lifetime of the charge carriers. However since this internal charge separation occurs in the plane of the p-type layer 102, the charge separation does not by itself contribute to an external current or voltage for the PV device 100. In order to collect these internally separated charges, an additional potential needs to be created for transferring electrons to an opposite external contact. In one or more embodiments, this potential for transferring the electrons can further be achieved with proper composition grading along the growth direction of the p-type doped group III-nitride layer 102. As such, by selecting the appropriate compositional grading of the p-type layer 102, the desired charge separation and collection can both be separately accomplished.

Figure 4:
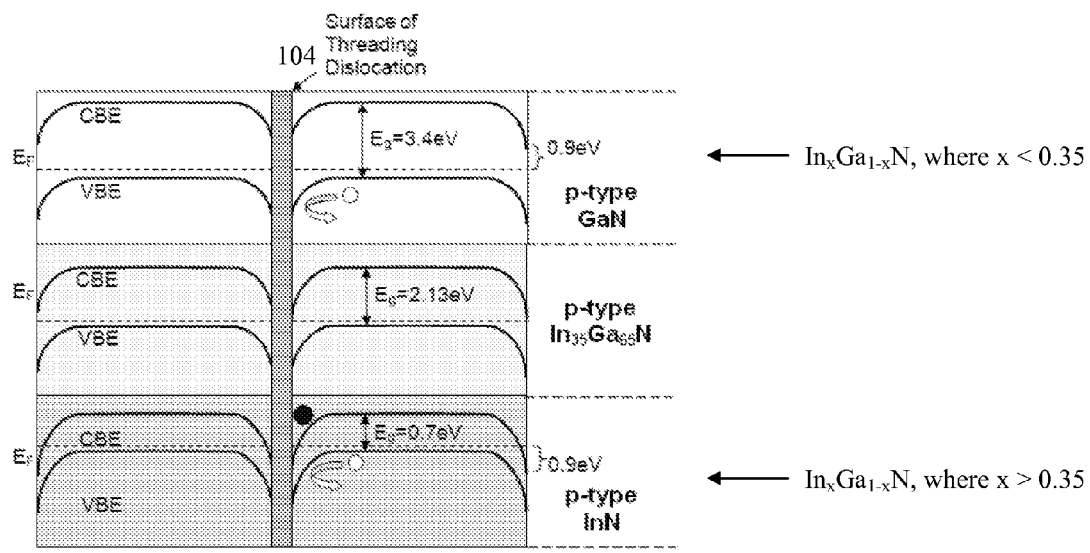
FIG. 4 is a block schematic illustration of the depletion layer around a threading dislocation for different InGaN alloys in accordance with one or more embodiments of the present disclosure.

In this context it is important to note the difference in the charge separation for different compositions of $In_xGa_{1-x}N$ alloys. Referring now to FIG. 4, the depletion layer around the threading dislocation 104 is illustrated for different compositions of $In_xGa_{1-x}N$. For $In_xGa_{1-x}N$ alloys having a larger In content (x>0.35), as illustrated in the lower portion of FIG. 4, both the electrons (represented by the dark circle) separated to the dislocations and holes (represented by the hollow circle) outside the depletion region are conducting. For $In_xGa_{1-x}N$ alloys having a lower In content (x<0.35), as illustrated in the upper portion of FIG. 4, only the holes outside the depletion region are conducting and the electrons separated to the threading dislocation 104 are trapped in non-conducting gap states. In this manner, the threading dislocation 104 forms a conducting n-type channel for $In_xGa_{1-x}N$ alloys with larger than 35% In content (x>0.35) and is non-conducting for $In_xGa_{1-x}N$ alloys with smaller than 35% In content (x<0.35).

Figure 5:
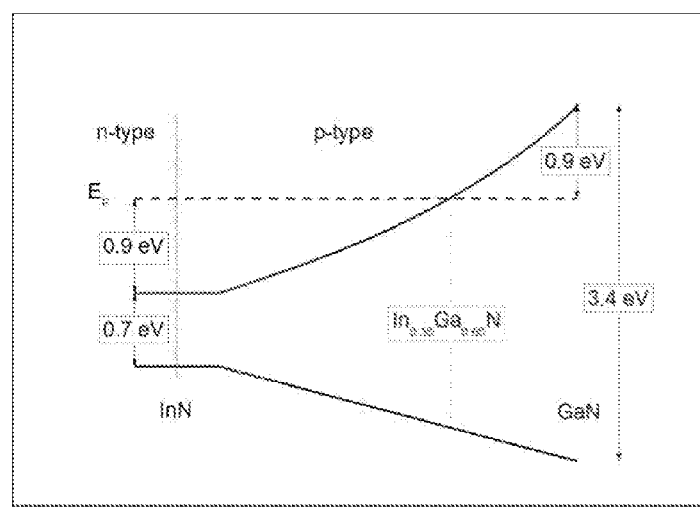
FIG. 5 is an illustration of an energy band diagram along the threading dislocation in $In_xGa_{1-x}N$ in accordance with one or more embodiments of the present disclosure.
Figure 6:
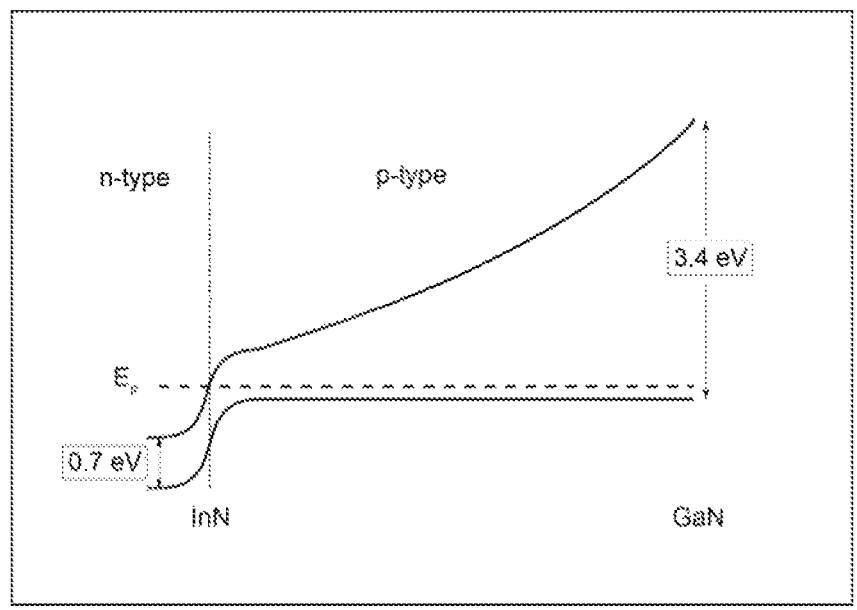
FIG. 6 is an illustration of an energy band diagram outside the threading dislocation depletion region in $In_xGa_{1-x}N$ in accordance with one or more embodiments of the present disclosure.

The vertical dependence of the band edges for the PV device 100 having three dimensional (3D) charge separation and collection in accordance with one or more embodiments is shown in the energy band diagrams of FIGS. 5 and 6. FIG. 5 shows the energy band diagram along the threading dislocation 104 extending from InN (bottom surface 106b) to GaN (top surface 106a). In this case, the Fermi energy is pinned in the conduction band for x>0.35 and in the band gap for x<0.35. Consequently the electrons at the dislocations can move freely to the substrate but have a barrier for reaching the surface contact. In contrast as seen in FIG. 6 that represents the band diagram for the region outside the band-bending region caused by the threading dislocation 104, a barrier for holes is formed at the transition from n to p InN. The valence band of the compositionally graded p-InGaN follows the Fermi energy and connects to the top surface contact. Therefore the holes will be transferred to the surface contact and blocked from the back contact. In one or more embodiments, p-type doping of one or more layers of the PV device 100 may be graded (e.g., graded Mg doping) in order to drive holes toward the surface contact.

The concept of the PV device 100 having three dimensional (3D) charge separation and collection in accordance with one or more embodiments described herein is entirely different from the existing solar cells in which charge is separation and charge collection results from the built-in electric field at the flat planar p-n junction.

In a first aspect, the PV device 100 described herein differs from the existing solar cells in that it provides three dimensional (3D) charge separation and collection throughout the p-type $In_xGa_{1-x}N$ layer 102 by making use of threading dislocations 104 that extend from surface (106a) to surface (106b) of the p-type $In_xGa_{1-x}N$ layer 102 and that are present throughout the p-type $In_xGa_{1-x}N$ layer 102, where again typical threading dislocation (TD) density ranges from $10^9$ to $10^{10}$ $cm^{-2}$ for ternary nitride alloys such that the average distance between threading dislocations 104 is about 100 to 350 nm. As described above, the electrostatic field around each of the threading dislocations 104 creates a band-bending region that splits photoexcited electron-hole pairs, separates electrons from holes, and accumulates electrons around the threading dislocations 104. Due to the density of the threading dislocations 104 and their extension from surface (106a) to surface (106b), the threading dislocations 104 separate and collect charge three dimensionally throughout the p-type $In_xGa_{1-x}N$ layer 102. This solves the issue of the short diffusion length of electron-hole pairs by providing a separation and collection mechanism adjacent to where almost any photoexcited electron-hole pairs are generated. Conversely, existing solar cells make use of two dimensional (2D) charge separation and collection that occurs solely at the flat planar p-n junction, such that due to short diffusion length issues only those photoexcited electron-hole pairs near the flat planar p-n junction are collected and contribute to cell current, whereas those photoexcited electron-hole pairs distant from the flat planar p-n junction end up recombining in the photoactive layer. Thus, existing solar cells using two dimensional (2D) charge separation and collection at the flat planar p-n junction tend to possess thinner films in view of short diffusion length issues. However, the PV device 100 described herein allows much thicker films (i.e., p-type $In_xGa_{1-x}N$ layer 102) to be grown since it allows for three dimensional (3D) charge separation and collection throughout the p-type $In_xGa_{1-x}N$ layer 102 by making use of threading dislocations 104 extending through the p-type $In_xGa_{1-x}N$ layer 102.

In a second aspect, the PV device 100 described herein differs from the existing solar cells in that this new PV device 100 of the present disclosure, the charge separation and charge collection are independent processes. In the first charge separation stage, a photoexcited electro-hole pair is separated by the field in the depletion region around the threading dislocations 104 such that the separated electrons accumulate at area 108 around the threading dislocations 104. The electrons are free to go to the substrate 122 side whereas holes go to the surface 106a. In the second charge collection stage, the composition grading of the $In_xGa_{1-x}N$ layer 102 (e.g., from InN to GaN) creates an internal potential moving the electrons toward a back contact (not shown in FIG. 3) on the substrate 122 side while moving the holes to the surface 106a. Conversely, in existing solar cells that make use of two dimensional (2D) charge separation and collection occurring solely at the flat planar p-n junction, the charge separation and collection are essentially an interconnected single process.

Figure 7:
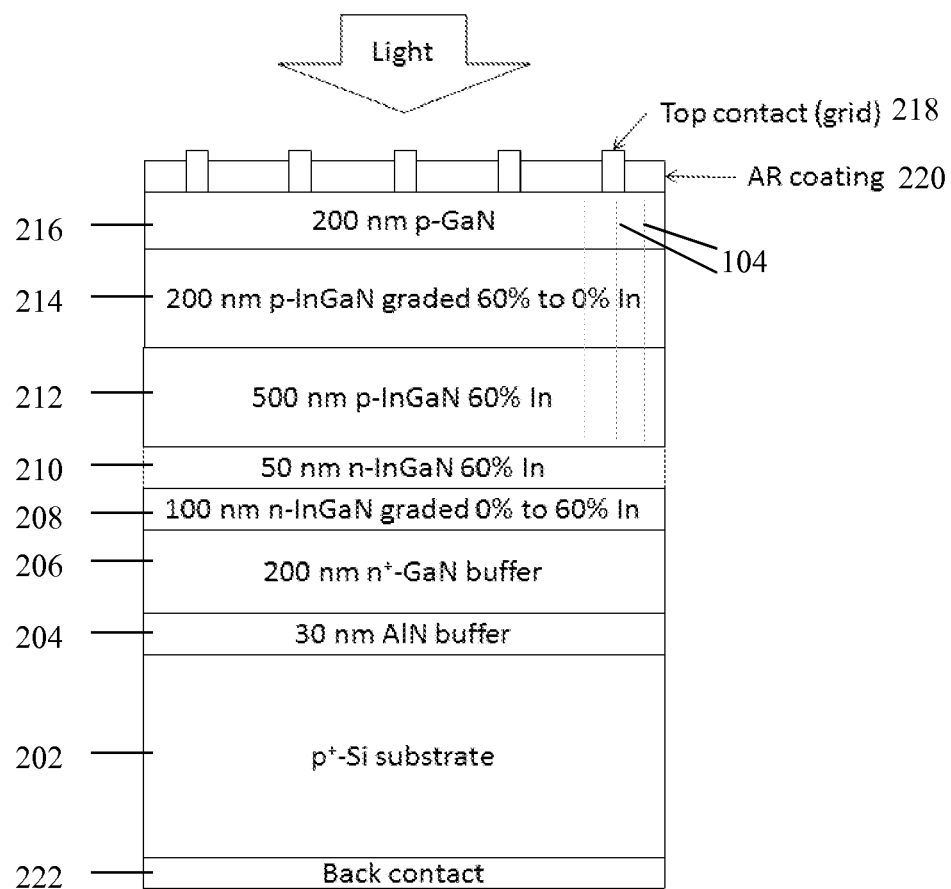
FIG. 7 is a block diagram representation of the layers of a single junction InGaN photovoltaic device with three dimensional (3D) charge separation and collection in accordance with one or more embodiments of the present disclosure.

Referring now to FIG. 7, a PV device having 3D charge separation and collection is formed as a single junction InGaN solar cell 200 in accordance with one or more embodiments. In the particular embodiment illustrated in FIG. 7, the single junction InGaN solar cell 200 is formed to possess a lowest band gap of approximately 1.4 eV, which corresponds to an In fraction of approximately 60% (x=0.60) in the $In_xGa_{1-x}N$ photoactive layer. The solar cell 200 comprises a multilayer structure that includes a bottom p+ doped Si substrate 202. The Si substrate 202 may comprise mono-crystalline silicon, polycrystalline, microcrystalline or even amorphous silicon. In one or more embodiments, a buffer layer 204 is deposited on the Si substrate 202, where the buffer layer 204 may comprise a thin nitride film, such as AlN (e.g., 30 nm of AlN shown in FIG. 7), $SiN_x$, GaN, or any other thin film combination that accommodates the lattice mismatch with the Si substrate 202 and facilitates the growth of the additional layers. In one or more embodiments, an additional 200 nm n+ GaN buffer layer 206 may be formed on AlN buffer layer 204.

A 100 nm layer of n-type $In_xGa_{1-x}N$ graded from 0% In to 60% In (from x=0 to x=0.60 with the value of x increasing moving away from buffer layer 206) is then deposited on buffer layer 206. It is understood that InGaN layer 208 and the other layers of solar cell 200 may be deposited by any appropriate epitaxial method (e.g., molecular beam epitaxy, MBE, MOCVD, HYPE, or other suitable deposition techniques). A 50 nm layer of n-type $In_xGa_{1-x}N$ 210 having 60% In (x=0.60) is deposited on n-type $In_xGa_{1-x}N$ layer 208. A 500 nm layer of p-type $In_xGa_{1-x}N$ 212 having 60% In (x=0.60) is deposited on n-type $In_xGa_{1-x}N$ 210, followed by a 200 nm layer of p-type $In_xGa_{1-x}N$ 214 graded from 60% In to 0% In (from x=0.60 to x=0 with the value of x decreasing moving away from p-type $In_xGa_{1-x}N$ layer 212), followed by a 200 nm layer of p-type GaN 216. The p-type $In_xGa_{1-x}N$ layers 212, 214 and 216 acts as a photoactive material absorbing part of the incident solar radiation passing through the device 200 in a process that generates photoexcited electron-hole pairs. The p-type $In_xGa_{1-x}N$ layers 212, 214 and 216 further include a certain density of threading dislocations 104 extending there through for separating and collecting the photoexcited electron-hole pairs.

In one or more embodiments, a top contact 218 is formed on the top surface of the p-type GaN layer 216, where the top contact 218 can be formed of an electrically conductive material as a grid (as shown in FIG. 7) or otherwise using a layer of semi-transparent material (e.g., NiAl) or a transparent conducting material (e.g., transparent conducting oxide (TCO)), so as to allow the desired light to enter into the solar cell 200 and photoexcite the electron-hole pairs in layers 212, 214 and 216. In one or more embodiments, an antireflective coating 220 may also be formed on the top surface of the p-type GaN layer 216, such as in between the portion of the grid top contact 218. A back contact 222 formed of any electrically conductive material is formed on the back of the p-Si substrate 202 for collecting the current generated by the solar cell 200.

As light enters the solar cell 200, light having an energy level above the band gap of the p-type $In_xGa_{1-x}N$ layers 212, 214 and 216 generates photoexcited electron-hole pairs that are separated by the field of the threading dislocations 104 and accumulated around the threading dislocations 104 as described herein. The accumulated electrons are then transported along the n-type channel provided by the threading dislocations 104 for collection by the n-type $In_xGa_{1-x}N$ layer 210. The collected electrons are in turn passed through the remaining layers of the solar cell 200 for collection at the back contact 222, while the separated and accumulate holes are transported to the top contact 218. This flow of the separated electron-hole pairs generated the current and voltage for the solar cell 200.

Figure 8:
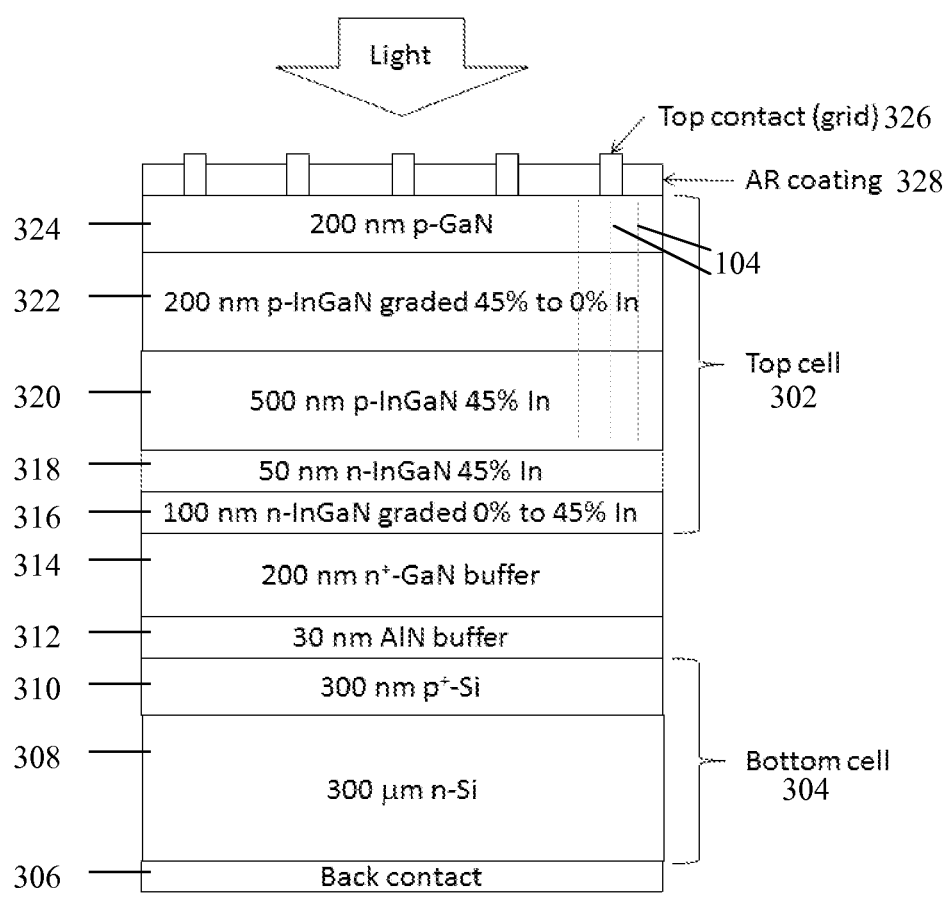
FIG. 8 is a block diagram representation of the layers of a dual junction InGaN/Si tandem photovoltaic device with three dimensional (3D) charge separation and collection in accordance with one or more embodiments of the present disclosure.

Referring now to FIG. 8, a PV device having 3D charge separation and collection is formed as a dual junction InGaN/Si tandem solar cell 300 in accordance with one or more embodiments. The dual junction InGaN/Si tandem solar cell 300 includes a top cell 302 having higher band gap materials for absorbing higher energy light to generate and contribute to cell current and a bottom cell 304 having lower band gap materials for absorbing lower energy light to generate and contribute to cell current. In this dual junction InGaN/Si tandem solar cell 300, the top cell 302 is formed to possess a lowest $In_xGa_{1-x}N$ bandgap of approximately 1.7 eV to 1.8 eV, which corresponds to an In fraction of approximately 45% (x=0.45). The bottom cell 304 is formed to possess a bandgap of approximately 1.1 eV.

In one or more embodiments, the bottom cell 304 is formed by doping a 300 nm layer 310 p-type on a 300 μm n-type wafer of Si 308. A back contact 306 formed of any electrically conductive material is formed on the back of the n-type Si layer 308 for collecting the overall current generated by the solar cell 300. In one or more embodiments, a buffer layer 312 is deposited on the Si layer 310, where the buffer layer 312 may comprise a thin nitride film, such as AlN (e.g., 30 nm of AlN shown in FIG. 8), $SiN_x$, GaN, or any other thin film combination that accommodates the lattice mismatch with the Si layer 310 and facilitates the growth of the additional layers. In one or more embodiments, an additional 200 nm n-F GaN buffer layer 314 may be formed on AlN buffer layer 312.

In one or more embodiments, the top cell 302 is then formed by depositing a 100 nm layer of n-type $In_xGa_{1-x}N$ 316 graded from 0% In to 45% In (from x=0 to x=0.45 with the value of x increasing moving away from buffer layer 314) is then deposited on buffer layer 314. It is understood that $In_xGa_{1-x}N$ layer 316 and the other layers of solar cell 300 may be deposited by any appropriate epitaxial method (e.g., molecular beam epitaxy, MBE, MOCVD, HYPE, or other suitable deposition techniques). A 50 nm layer of n-type $In_xGa_{1-x}N$ 318 having 45% In (x=0.45) is deposited on n-type $In_xGa_{1-x}N$ layer 316. A 500 nm layer of p-type $In_xGa_{1-x}N$ 320 having 45% In (x–0.45) is deposited on n-type $In_xGa_{1-x}N$ 318, followed by a 200 nm layer of p-type $In_xGa_{1-x}N$ 322 graded from 45% In to 0% In (from x=0.45 to x=0 with the value of x decreasing moving away from p-type $In_xGa_{1-x}N$ layer 322), followed by a 200 nm layer of p-type GaN 324. The p-type $In_xGa_{1-x}N$ layers 320, 322 and 324 acts as a photoactive material absorbing part of the incident solar radiation passing through the device 300 in a process that generates photoexcited electron-hole pairs. The p-type $In_xGa_{1-x}N$ layers 320, 322 and 324 further include a certain density of threading dislocations 104 extending there through for separating and collecting the photoexcited electron-hole pairs.

In one or more embodiments, a top contact 326 is formed on the top surface of the p-type GaN layer 324, where the top contact 326 can be formed of an electrically conductive material as a grid (as shown in FIG. 8) or otherwise using a layer of semi-transparent material (e.g., NiAu) or a transparent conducting material (e.g., transparent conducting oxide (TCO)), so as to allow the desired light to enter into the solar cell 300 and photoexcite the electron-hole pairs in layers 320, 322 and 324. In one or more embodiments, an antireflective coating 328 may also be formed on the top surface of the p-type GaN layer 324, such as in between the portion of the grid top contact 326.

As light enters the solar cell 300, light having an energy level above the band gap of the p-type $In_xGa_{1-x}N$ layers 320, 322 and 324 of the top cell 302 (e.g., above 1.7 eV) generates photoexcited electron-hole pairs that are separated by the field of the threading dislocations 104 and accumulated around the threading dislocations 104 as described herein. The accumulated electrons are then transported along the n-type channel provided by the threading dislocations 104 for collection by the n-type $In_xGa_{1-x}N$ layer 318. The collected electrons are in turn passed through the remaining layers of the solar cell 300, including through the bottom cell 304, for collection at the back contact 306, while the separated and accumulate holes are transported to the top contact 326. Further, the remaining light traveling through the solar cell 300 having an energy level above the band gap of the bottom cell 304 (e.g., above 1.1 eV) generates current according to traditional two dimensional (2D) charge separation and collection occurring solely at the flat planar p/n junction between the Si layers 308 and 310. The current generated by bottom cell 304 further contributes to the current generated by top cell 302.

It should be noted that the particular materials, compositions and thicknesses described in connection with the embodiments illustrated in FIGS. 7 and 8 are merely exemplary embodiments and are not intended to limit the possible applications of the teachings herein. It is understood that the various layers, materials, compositions and thicknesses of the PV devices described herein can be modified to accomplish desired charge separation and collection and other desired characteristics of the PV devices. While the various embodiments described herein describe InGaN as the photoactive layer, it is further understood that InAlN ternary or InGaAlN quaternary alloys may be interchangeably utilized in the various embodiments described herein in place of InGaN. For example, for $In_yAl_{1-y}N$ alloys the In concentration is graded from an In concentration above 57% (y>0.57) to an In concentration below 57% (y<0.57). Still further, while the various embodiments described herein describe the intrinsic defects as comprising threading dislocations 104, it is understood that any intrinsic defects or intrinsic surfaces that provide a surface for Fermi level pinning and that satisfy the other characteristics of the threading dislocations 104 may be interchangeably utilized in the various embodiments described herein in place of the threading dislocations 104.

In one or more embodiments, the three dimensional (3D) charge separation and collection provided by the photovoltaic devices described herein allow much thicker films to be utilized in the photoactive layers of the devices as compared to traditional solar cells that rely solely on 2D charge separation at the planar flat p/n junction. Furthermore, the improved photovoltaic devices described herein actually take advantage of the intrinsic defects that are created in the photoactive layers of the devices during the formation process by turning such intrinsic defects into a mechanism for separating and collecting charge three dimensionally throughout the photoactive layers. This allows the photovoltaic devices described herein to be formed from much lower quality materials, where substantial efforts and costs have traditionally been made to produce previous solar cells using the highest quality materials (i.e., the lowest number of defects). By making use of these lower quality materials, manufacturing efforts and costs can be reduced. It should be noted that the quality of the materials used can be selectively modified so as to control the number of intrinsic defects (e.g., threading dislocations 104) based on the desired characteristics of the solar cells/PV devices.

While the apparatus and method have been described in terms of what are presently considered to be the most practical and preferred embodiments, it is to be understood that the disclosure need not be limited to the disclosed embodiments. It is intended to cover various modifications and similar arrangements included within the spirit and scope of the claims, the scope of which should be accorded the broadest interpretation so as to encompass all such modifications and similar structures. The present disclosure includes any and all embodiments of the following claims.

What is claimed is:

1. A solar cell, comprising:
   a layer of a p-type Group III-nitride alloy for absorbing a portion of the solar spectrum upon exposure to light to generate photoexcited electron-hole pairs, wherein the p-type Group III-nitride alloy includes a top surface and a bottom surface, wherein the p-type Group III-nitride alloy includes a conduction band having a conduction band edge and a valence band having a valence band edge having a band gap there between the conduction band edge and the valence band edge;
   a plurality of structural imperfections within the p-type Group III-nitride alloy, each of the structural imperfections having a surface that extends over a full distance from a point on the top surface to a point on the bottom surface of the p-type Group III-nitride alloy, wherein a Fermi level stabilization energy, $E_{FS}$, exists representing a Fermi level pinning position at the surfaces of the structural imperfections;
   wherein the p-type Group III-nitride alloy is compositionally graded along the plurality of structural imperfections between at least a first area and a second area of the p-type Group III-nitride alloy such that the first area possesses a first composition of the p-type Group III-nitride alloy having its conduction band edge beneath the Fermi level stabilization energy, $E_{FS}$, and the second area possesses a second composition of the p-type Group III-nitride alloy having its conduction band edge above the Fermi level stabilization energy, $E_{FS}$; and
   a layer of n-type Group III-nitride alloy.

2. The solar cell of claim 1, further comprising an electrostatic field between each of the plurality of structural imperfections and the p-type Group III-nitride alloy for separating the photoexcited electron-hole pairs and accumulating electrons around the structural imperfections in the first area possessing a first composition of the p-type Group III-nitride alloy having its conduction band edge beneath the Fermi level stabilization energy, $E_{FS}$.

3. The solar cell of claim 2, wherein the compositional grading of the p-type Group III-nitride alloy creates a potential that drives the electrons accumulating around the structural imperfections to the layer of n-type Group III-nitride alloy for collection.

4. The solar cell of claim 3, wherein the charge separation of the photoexcited electron-hole pairs is performed separately from collection of the electrons at the n-type Group III-nitride alloy.

5. The solar cell of claim 2, wherein the p-type Group III-nitride alloy layer comprises $In_xGa_{1-x}N$, where 0≤x≤1.0, wherein the first composition of the p-type Group III-nitride alloy having its conduction band edge beneath the Fermi level stabilization energy, $E_{FS}$, comprises $In_xGa_{1-x}N$, where $0.35<x\le1.0$ and wherein the second composition of the p-type Group III-nitride alloy having its conduction band edge above the Fermi level stabilization energy, $E_{FS}$, comprises $In_xGa_{1-x}N$, where $x<0.35$.

6. The solar cell of claim 2, wherein the p-type Group III-nitride alloy layer comprises $In_yAl_{1-y}N$, where $0\le y\le1.0$, wherein the first composition of the p-type Group III-nitride alloy having its conduction band edge beneath the Fermi level stabilization energy, $E_{FS}$, comprises $In_yAl_{1-y}N$ where $0.57<y\le1.0$ and wherein the second composition of the p-type Group III-nitride alloy having its conduction band edge above the Fermi level stabilization energy, $E_{FS}$, comprises $In_yAl_{1-y}N$ where $y<0.57$.

7. The solar cell of claim 2, wherein the p-type Group III-nitride alloy layer comprises an alloy of $In_xAl_yGa_{1-x-y}N$, where $0\le x, y\le 1$.

8. The solar cell of claim 1, wherein the structural imperfections comprise at least one of threading dislocations, grain boundaries, and/or columns in the p-type Group III-nitride alloy.

9. The solar cell of claim 2, wherein the structural imperfections are n-type conductors in the first area possessing a first composition of the p-type Group III-nitride alloy having its conduction band edge beneath the Fermi level stabilization energy, $E_{FS}$, to transport the accumulated photoexcited electrons to the layer of n-type Group III-nitride alloy.

10. The solar cell of claim 1, further comprising:
a first electrical contact coupled to the p-type Group III-nitride alloy layer;
a silicon base substrate; and
a second electrical contact coupled to the silicon base substrate.

11. The solar cell of claim 10, further comprising at least one buffer layer formed between the silicon base substrate and the n-type Group III-nitride alloy layer.

12. The solar cell of claim 10, wherein the p-type Group III-nitride alloy layer and the n-type Group III-nitride alloy layer form a top cell in the solar cell for absorbing a first portion of the solar spectrum, wherein the silicon base substrate is formed to possess a p-type region and an n-type region so as to form a bottom p-n junction cell in the solar cell for absorbing a second portion of the solar spectrum.

13. A solar cell, comprising:
a layer of a p-type Group III-nitride alloy for absorbing a portion of the solar spectrum upon exposure to light to generate photoexcited electron-hole pairs, wherein the p-type Group III-nitride alloy includes a top surface and a bottom surface;
a plurality of structural imperfections within the p-type Group III-nitride alloy, each of the structural imperfections having a surface that extends a full distance from the top surface to the bottom surface of the p-type Group III-nitride alloy;
wherein the p-type Group III-nitride alloy is compositionally graded along the plurality of structural imperfections between at least a first area and a second area of the p-type Group III-nitride alloy such that the first area possesses a first composition of the p-type Group III-nitride alloy having a conduction band edge beneath a Fermi level stabilization energy, and the second area possesses a second composition of the p-type Group III-nitride alloy having a conduction band edge above the Fermi level stabilization energy; and
a layer of n-type Group III-nitride alloy underlying the layer of p-type Group III-nitride alloy.

14. The solar cell of claim 13, further comprising a silicon substrate underlying the layer of n-type Group III-nitride alloy.

15. The solar cell of claim 13, wherein the p-type Group III-nitride alloy layer comprises $In_xGa_{1-x}N$, where $0\le x\le1.0$, wherein the first composition of the p-type Group III-nitride alloy comprises $In_xGa_{1-x}N$, where $0.35<x\le1.0$ and wherein the second composition of the p-type Group III-nitride alloy comprises $In_xGa_{1-x}N$, where $x<0.35$.

16. The solar cell of claim 13, wherein the plurality of structural imperfections comprises a threading dislocation, and an electron accumulation area of the threading dislocation increases in size as the threading dislocation approaches the bottom surface of the p-type Group III-nitride alloy.

17. The solar cell of claim 13, wherein the p-type Group III-nitride alloy layer comprises $In_yAl_{1-y}N$, where $0\le y\le1.0$, wherein the first composition of the p-type Group III-nitride alloy comprises $In_yAl_{1-y}N$ where $0.57<y\le1.0$ and wherein the second composition of the p-type Group III-nitride alloy comprises $In_yAl_{1-y}N$ where $y<0.57$.

18. The solar cell of claim 13, wherein the p-type Group III-nitride alloy layer comprises an alloy of $In_xAl_yGa_{1-x-y}N$, where $0\le x, y\le 1$.

19. The solar cell of claim 13, wherein the p-type Group III-nitride alloy layer has a thickness of at least 200 nm.

20. A solar cell, comprising:
a layer of a p-type Group III-nitride alloy for absorbing a portion of the solar spectrum upon exposure to light to generate photoexcited electron-hole pairs, wherein the p-type Group III-nitride alloy includes a top surface and a bottom surface, and wherein the p-type Group III-nitride alloy layer has a thickness of at least 200 nm;
a plurality of structural imperfections within the p-type Group III-nitride alloy, each of the structural imperfections having a surface that fully extends from the top surface to the bottom surface of the p-type Group III-nitride alloy, wherein the plurality of structural imperfections comprises a threading dislocation, and an electron accumulation area of the threading dislocation increases in size as the threading dislocation approaches the bottom surface of the p-type Group III-nitride alloy;
wherein the p-type Group III-nitride alloy is compositionally graded along the plurality of structural imperfections between at least a first area and a second area of the p-type Group III-nitride alloy such that the first area possesses a first composition of the p-type Group III-nitride alloy having a conduction band edge beneath a Fermi level stabilization energy, and the second area possesses a second composition of the p-type Group III-nitride alloy having a conduction band edge above the Fermi level stabilization energy; and
a layer of n-type Group III-nitride alloy underlying the layer of p-type Group III-nitride alloy.

* * * * *